United States Patent [19]

Thomas

[11] 3,974,443

[45] Aug. 10, 1976

[54] CONDUCTIVE LINE WIDTH AND RESISTIVITY MEASURING SYSTEM

[75] Inventor: Donald Ralph Thomas, Westford, Vt.

[73] Assignee: International Business Machines Corporation, Armonk, N.Y.

[22] Filed: Jan. 2, 1975

[21] Appl. No.: 538,288

[52] U.S. Cl. ................................. 324/64; 324/62; 324/65 R; 324/158 R
[51] Int. Cl.² ........................................ G01R 27/14
[58] Field of Search .......... 324/64, 62, 65 R, 158 R; 29/574

[56] References Cited
UNITED STATES PATENTS

| | | | |
|---|---|---|---|
| 2,659,861 | 11/1953 | Branson | 324/64 |
| 2,659,862 | 11/1953 | Branson | 324/64 |
| 2,854,626 | 9/1958 | Davidson et al. | 324/64 |
| 3,134,077 | 5/1974 | Hutchins et al. | 29/574 |
| 3,721,897 | 3/1973 | Edling | 324/64 |
| 3,753,093 | 8/1973 | Gardner et al. | 324/65 R |

Primary Examiner—Stanley T. Krawczewicz
Attorney, Agent, or Firm—Stephen J. Limanek

[57] ABSTRACT

Method and apparatus for measuring or determining characteristics, such as width and resistivity of a given conductive line, particularly a conductive line produced by integrated circuit technology. The conductive line, having a first width which is formed on an insulating medium is disposed in the vicinity of or adjacent to a second line having a second width different from the first width, which is also conductive and which is made by the same process by which the given conductive line was made. A common constant current is passed through the given conductive line and through the second line. A first voltage is measured between two points spaced apart by a given distance along the given conductive line and a second voltage is measured between two points spaced apart by the given distance along the second line. Characteristics, such as width and resistivity, of the given conductive line, as well as those of the second line, are then determined by utilizing relationships between the measured voltages and known line constants.

10 Claims, 2 Drawing Figures

CONDUCTIVE LINE WIDTH AND RESISTIVITY MEASURING SYSTEM

FIELD OF THE INVENTION:

This invention relates to a method and apparatus for determining characteristics, such as line width and resistivity, of conductive lines, particularly lines made by integrated circuit technology.

In the fabrication of integrated circuits in semiconductor wafers, conductive lines are formed within or over a semiconductor body, e.g., made of silicon. Conductive lines made within a semiconductor body are generally made by diffusing a dopant, such as boron or arsenic, in heavy concentration through a diffusion mask containing a given pattern, while conductive lines formed over a semiconductor body are made from a conductive layer of, e.g., aluminum or heavily doped polysilicon, disposed on an insulating layer interposed between the semiconductor body and the conductive layer. The width and length of the conductive lines formed on the insulating layer are determined, as is well known, by the pattern in a mask and photoresist and etch condition employed.

When layouts are designed for semiconductor integrated circuits, an important consideration for successful operation of a given circuit is the width of the conductive lines formed on or in the semiconductor body. As each layout is prepared, an optimum or design width is determined for each conductive line. This nominal width of the line can be attained only if perfect processing is employed throughout all manufacturing steps of the line. However, it is well known that masks produced for making integrated circuit lines often deviate from layout design specifications due, e.g., to over or under exposure of photoresist during the mask making process. It is also known that even if the mask contains the nominal width for a desired line, over or under etching of the conductive layer produces lines that are either too thin or too wide compared with the nominal or design width. Lines produced with significant variations of width from the nominal width can cause reliability problems due to undesirable short or open circuits or resistances and, therefore, should be detected as soon as possible during the manufacturing process of an integrated circuit.

Another important characteristic of conductive lines used in semiconductor integrated circuits is the resistivity of the lines, particularly lines made of doped polysilicon or lines produced by dopants diffused into a semiconductor body. Lines having improper resistivities can produce operational and reliability problems.

The determination of the amount of deviation of the actual line width from the nominal or design line width and the actual resistivity of the line from the nominal line resistivity can serve as a prediction at an early stage in the process of making integrated circuits of the success of the operability of the circuits.

DESCRIPTION OF THE PRIOR ART

Various systems have been suggested for determining the characteristics of lines, layers or bodies, particularly in semiconductor technology. In U.S. Pat. No. 3,650,020 a method employing a V-shaped mask pattern is described for monitoring the extent of lateral and vertical diffusion of regions of transistor elements during the production of integrated circuits, with oxide etching and photographic mask definition also being monitored during fabrication. The base width of a transistor is determined in U.S. Pat. No. 3,465,427, commonly assigned, by determining the sheet resistance of the base material, and in U.S. Pat. No. 3,440,715 by determining the current gain characteristics of test transistors. The specific resistance of thin semiconductor layers is determined in U.S. Pat. No. 3,287,637 by placing the layer to be investigated between two plate-shaped electrodes in spaced apart relation to both and passing a high-frequency current through the layer while noting the value of the resulting voltage drop across the layer and the high frequency current value. Many well known optical systems have been used to determine line widths of conductive lines. In commonly assigned U.S. Pat. No. 3,808,527 by the present inventor, any misalignment of masks during the production of integrated circuits is determined by simply measuring appropriate voltages in a test circuit.

SUMMARY OF THE INVENTION:

An object of this invention is to provide an improved conductive line characteristic measuring system.

It is another object of this invention to provide an improved line characteristic measuring system which requires primarily electrical measurements.

Yet a further object of this invention is to accurately and automatically determine the width and resistivity of conductive lines by obtaining electrical measurements.

Still a further object of this invention is to provide a line width measuring system which is faster than known visual measurement systems and which is independent of resistivity.

A further object of this invention is to provide a conductive line measuring system capable of readily establishing a large statistical data base.

Still another object of this invention is to provide an improved line characteristic measuring system capable of determining resistivity independent of line width variations.

Yet another object of the invention is to provide a line characteristic measuring system wherein both line width variations and line resistivity are obtainable simultaneously.

These and other objects of the invention are attained by producing in a common process first and second conductive lines having different nominal or design widths. A current of the same value is passed through each of the two lines and voltage drops are measured between two equally spaced apart points on the two lines. Characteristics such as line width variation from the nominal line width and the resistivity of the line are determined by utilizing the voltage drops in appropriate relationship with known line constants.

The foregoing and other objects, features and advantages of the invention will be apparent from the following more particular description of the preferred embodiment of the invention, as illustrated in the accompanying drawing.

Figure 1:
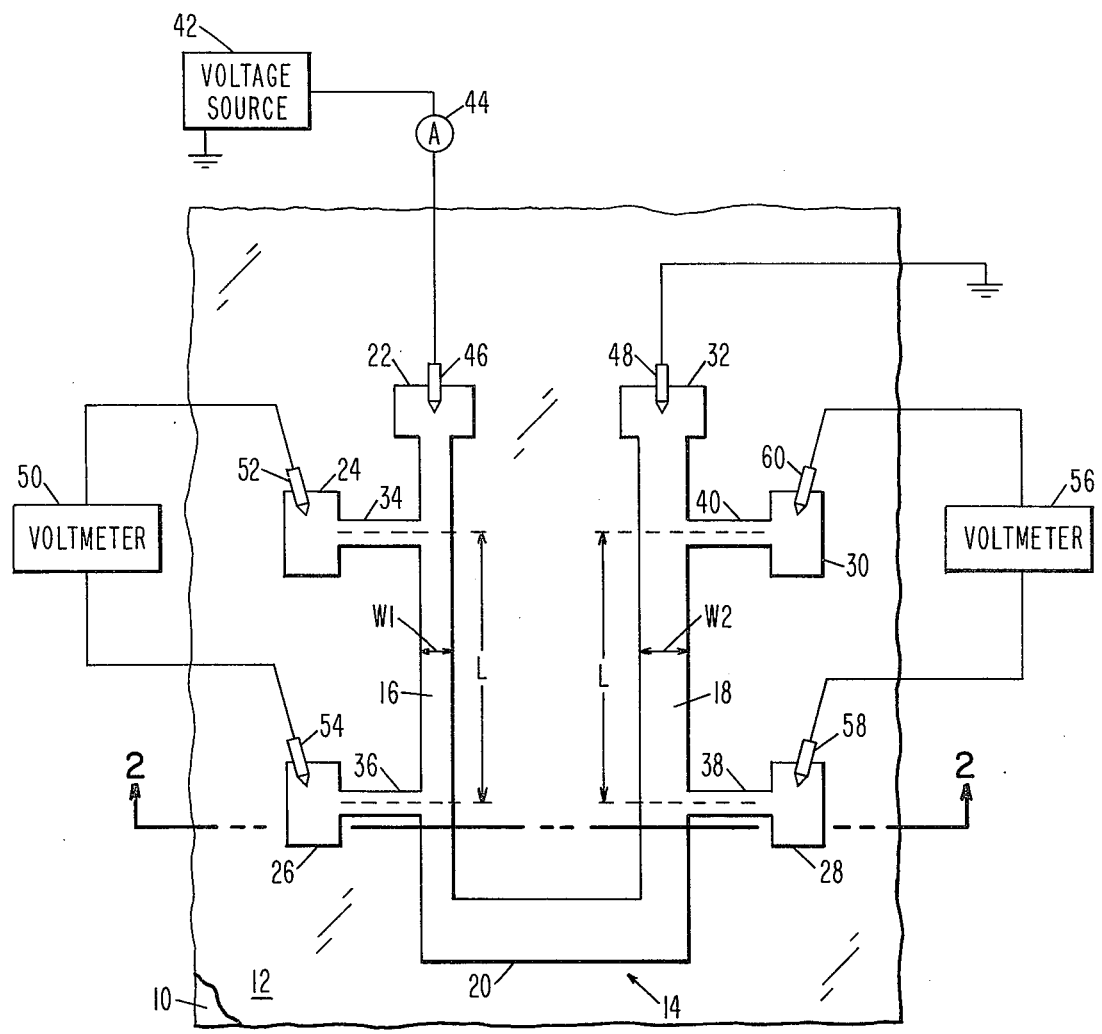
FIG. 1 is a plan view of a portion of a semiconductor body or wafer showing an embodiment of a circuit used for determining conductive line characteristics.
Figure 2:
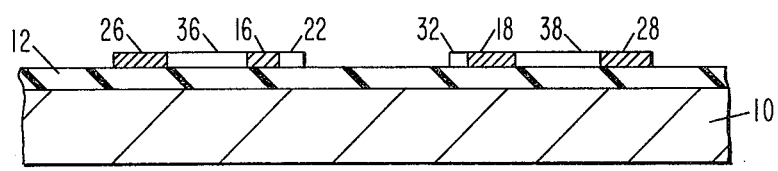
FIG. 2 is a sectional view taken through line 2—2 of FIG. 1.

DESCRIPTION OF THE PREFERRED EMBODIMENT:

Referring now to the drawing in more detail, there is shown in FIGS. 1 and 2 a portion of a substrate such as a semiconductor wafer or chip 10, preferably made of silicon, on which there is disposed an insulating layer 12 made, e.g., of silicon dioxide. A conductive test pattern 14 made, e.g., of aluminum is formed on the insulating layer 12, preferably in a kerf area. The conductive pattern 14 includes a first conductive line 16 having a width $W_1$ and a second conductive line 18 having a width $W_2$ with a line interconnection 20 serially connecting first and second lines 16 and 18. Also included in the conductive pattern 14 are probe pads 22, 24, 26, 28, 30 and 32. Probe arms 34 and 36 connect probe pads 24 and 26, respectively, to the first conductive line 16, with probe arms 34 and 36 being spaced apart at their points of contact with the conductive line 16 by an effective distance equal to L. Probe arms 38 and 40 connect probe pads 28 and 30, respectively, to the second conductive line 18, with probe arms 38 and 40 being spaced apart at their points of contact with the conductive line 18 by an effective distance also equal to L.

As is well known, conductive lines or patterns, such as the aluminum pattern 14, may be made by evaporating or sputtering a layer of aluminum of any desired thickness over the insulating layer 12 and then employing a suitable mask over a photoresist applied to the aluminum layer. Exposed portions of the photoresist are irradiated by suitable electromagnetic radiation and an etchant is used to dissolve the undesired portions of the aluminum layer to form the desired pattern, such as that shown in FIG. 1 at 14.

It should be understood that the masks used to make the conductive or aluminum patterns are generally made from a chromium layer on a glass employing a photoresist and appropriate irradiation techniques. Over or under exposing the photoresist on the mask causes variations in the line width of lines in the mask pattern from the nominal or design value. Furthermore, over or under etching the chromium also causes variations in the line width of lines in the mask pattern from the nominal or design value. As is also known, substantial line width variations are often produced in the desired aluminum pattern, when with the use of these masks employed over the photoresist on the conductive or aluminum layer, the aluminum layer is either over or under etched.

In accordance with the present invention, the line width variations $\Delta W$ from the nominal width $W_N$ of conductive lines, made by a common process such as are lines 16 and 18 of pattern 14 in FIG. 1 of the drawing, is monitored by utilizing certain voltage relationships in pattern 14 along with known line constants.

It is known that in a conductive line $R = \rho L/W$, where R is the electrical resistance, $\rho$ is the sheet resistivity, L is the conductor or line length and W is the conductor width.

To determine the line width variation of lines 16 and 18 of pattern 14 in FIG. 1 from the design width, current from voltage source 42 passes through ammeter 44, a testing probe 46 and serially lines 16 and 18 interconnected by line interconnection 20 into ground via testing probe 48. Voltmeter 50 connected to probe pad 24 through testing probe 52 and to probe pad 26 through testing probe 54 measures the voltage $V_{24-26}$ between pads 24 and 26, i.e., the voltage drop along length L of the first conductive line 16. Voltmeter 56 connected to probe pad 28 through testing probe 58 and to probe pad 30 through testing probe 60 measures the voltage $V_{28-30}$ between pads 28 and 30, i.e., the voltage drop along length L of the second conductive line 18.

The resistance along length L of conductive line 16 is $$R_{24-26} = \frac{V_{24-26}}{I}$$

and the resistance along length L of conductive line 18 is $$R_{28-30} = \frac{V_{28-30}}{I},$$

where I is the common current passing through lines 16 and 18.

The resistance $R_{24-26}$ is also equal to $\rho L/W_1$ and $R_{28-30}$ is equal to $\rho L/W_2$, where $\rho$ is the resistivity of lines 16 and 18, $W_1$ is the actual width of line 16 and $W_2$ is the actual width of line 18. Accordingly, $R_{24-26}W_1 = \rho L$ and $R_{28-30}W_2 = \rho L$ and, therefore, $R_{24-26}W_1 = R_{28-30}W_2$. If the width $W_1$ is similar in magnitude to the width $W_2$ and lines 16 and 18 are in close proximity, then the variation $\Delta W_1$ in the width of line 16 and the variation $\Delta W_2$ in the width of line 18 can be considered to be equal and may be referred to as $\Delta W$. Thus, $R_{24-26}(W_{1N} + \Delta W) = R_{28-30}(W_{2N} + \Delta W)$ and $$\Delta W = \frac{R_{28-30}(W_{2N}) - R_{24-26}(W_{1N})}{R_{24-26} - R_{28-30}}.$$

where $W_{1N}$ and $W_{2N}$ are the nominal or design widths of lines 16 and 18, respectively.

Knowing the nominal widths of lines 16 and 18, the actual line widths of lines 16 and 18 are readily determined by measuring the voltages $V_{24-26}$ and $V_{28-30}$ to find $\Delta W$ and then adding or subtracting $\Delta W$ from the nominal line widths. In practice the nominal width of line 16 may be, e.g., 100 microinches and line 18 may be as large as, e.g., 200 microinches. Typical variations in the widths of these lines may be $\pm \Delta W = 20$ to 80 microinches. The variation contribution caused by the mask pattern is generally small, but not negligible, compared with variations caused by, e.g., over or under etching the conductive or aluminum layer on the insulating layer 12.

It can be seen that the invention provides an improved conductive line characteristic measuring system which determines line widths quickly, accurately and inexpensively without the use of cumbersome visual measurement apparatus. Furthermore, it can be seen that this system can be readily automated to establish a large reliable statistical base for improved line control.

The system of the present invention may also be employed to determine the resistivity of the lines 16 and 18, since $$W_{1N} + \Delta W = \frac{\rho L}{R_{24-26}} \quad \text{and} \quad W_{2N} + \Delta W = \frac{\rho L}{R_{28-30}}.$$

Thus, $$\Delta W = \frac{\rho L}{R_{24-26}} - W_{1N} = \frac{\rho L}{R_{28-30}} - W_{2N},$$

and $$\rho L \frac{[R_{28-30} - R_{24-26}]}{[R_{24-26} R_{28-30}]} = W_{1N} - W_{2N}$$

$$\rho = \frac{1}{L} \frac{(W_{1N} - W_{2N}) R_{24-26} R_{28-30}}{R_{28-30} - R_{24-26}}$$

It should be noted that the resistivity $\rho$ is independent of line width variations but that the resistivity may be obtained simultaneously with line variations.

It should be understood that although it was indicated that pattern 14 was an aluminum pattern, the pattern may be made of any other conductive material such as doped polysilicon or lines diffused into a semiconductor body by any suitable dopant. Furthermore, lines 16 and 18 need not be interconnected by a permanent line, such as line interconnection 20, but may be separate lines interconnected by appropriate test equipment connections.

While the invention has been particularly shown and described with reference to a preferred embodiment thereof, it will be understood by those skilled in the art that various changes in form and details may be made therein without departing from the spirit and scope of the invention.

What is claimed is:

1. A measuring system comprising
a first conductive line having a known first nominal width, a second conductive line having a known second nominal width, means for passing current of equal value through each of said lines, and means for measuring the voltage between two points on each of said lines spaced apart by equal distances to determine in relationship with said first and second nominal widths characteristics of said conductive lines.

2. A measuring system as set forth in claim 1 wherein one of said characteristics is line width variation from said nominal widths derived in accordance with the relationship $$\Delta W = \frac{V_2 W_{2N} - V_1 W_{1N}}{V_1 - V_2},$$

where $V_1$ and $V_2$ are the voltages between the two points on the first and second lines, respectively, and $W_{1N}$ and $W_{2N}$ are the nominal width of the first and second lines, respectively.

3. A measuring system as set forth in claim 1 further comprising means for measuring current flow through said lines and wherein one of said characteristics is resistivity derived in accordance with the relationship $$\rho = \frac{1}{LI} \frac{(W_{1N} - W_{2N}) V_1 V_2}{V_2 - V_1},$$

where
$V_1$ and $V_2$ are the voltages between the two points on the first and second lines, respectively, $W_{1N}$ and $W_{2N}$ are the nominal width of the first and second lines, respectively, L is the distance between said two points and I is the current flowing through said lines.

4. A measuring system as set forth in claim 1 wherein said measuring means includes a probe pad connected to each of said points.

5. A measuring system as set forth in claim 4 wherein said lines are disposed adjacent to each other on an insulating medium.

6. A measuring system as set forth in claim 5 wherein said first nominal width is similar in size to said second nominal width and said insulating medium forms a portion of a semiconductor integrated circuit.

7. A measuring system as set forth in claim 1 wherein said means for passing current includes probe pads connected to said first and second lines.

8. A method for measuring characteristics of conductive lines comprising
forming a first conductive line having a known first nominal width and a second conductive line having a known second nominal width,
passing equal amounts of current through said first and second conductive lines,
measuring the voltage between two points on each of said lines spaced apart by equal distances and
calculating characteristics of said conductive lines as relationships of the voltages with said first and second nominal widths.

9. A method as set forth in claim 8 wherein one of said characteristics is line width variation from said nominal widths derived in accordance with the relationship $$\Delta W = \frac{V_2 W_{2N} - V_1 W_{1N}}{V_1 - V_2},$$

where $V_1$ and $V_2$ are the voltages between the two points on the first and second lines, respectively, and $W_{1N}$ and $W_{2N}$ are the nominal width of the first and second lines, respectively.

10. A method as set forth in claim 8 further comprising measuring current flow through said lines and wherein one of said characteristics is resistivity derived in accordance with the relationship $$\rho = \frac{1}{LI} \frac{(W_{1N} - W_{2N}) V_1 V_2}{V_2 - V_1},$$

where
$V_1$ and $V_2$ are the voltages between the two points on the first and second lines, respectively, $W_{1N}$ and $W_{2N}$ are the nominal width of the first and second lines, respectively, L is the distance between said two points and I is the current flowing through said lines.

* * * * *